United States Patent
Hetherington et al.

(10) Patent No.: US 6,327,667 B1
(45) Date of Patent: Dec. 4, 2001

(54) APPARATUS AND METHOD FOR OPERATING CLOCK SENSITIVE DEVICES IN MULTIPLE TIMING DOMAINS

(75) Inventors: Ricky C. Hetherington, Westborough; Peter J. Bannon, Concord, both of MA (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 08/893,309

(22) Filed: Jul. 15, 1997

Related U.S. Application Data (63) Continuation of application No. 08/440,151, filed on May 12, 1995, now abandoned.

(51) Int. Cl.[7] .................................................. G06F 1/04
(52) U.S. Cl. .................................................. 713/500; 713/600
(58) Field of Search .................................................. 713/400, 500, 713/501, 600

(56) References Cited

U.S. PATENT DOCUMENTS

| | | | |
|---|---|---|---|
| 4,405,898 | * 9/1983 | Flemming | 328/72 |
| 5,077,686 | * 12/1991 | Rubinstein | 395/550 |
| 5,210,858 | * 5/1993 | Jensen et al. | 395/550 |
| 5,256,912 | * 10/1993 | Rios | 307/269 |
| 5,345,109 | * 9/1994 | Mehta | 307/271 |
| 5,434,996 | * 7/1995 | Bell | 359/550 |
| 5,448,715 | * 9/1995 | Lelm et al. | 395/550 |
| 5,471,587 | * 11/1995 | Fernando | 395/309 |
| 5,491,814 | * 2/1996 | Yee et al. | 395/550 |
| 5,537,582 | * 7/1996 | Draeger | 395/550 |
| 5,692,137 | * 11/1997 | Regal et al. | 710/129 |
| 5,754,833 | * 5/1998 | Singh et al. | 713/400 |

OTHER PUBLICATIONS

DeLano et al., "A High Speed Superscalar PA–RISC Processor", IEEE COMPCON Conference, 1992, pp. 116–121.*

Liu et al., "Microcomputer Systems: The 8086/8088 Family Architecture, Programming and Design", Prentice–Hall, 1986, pp. 16–20.*

* cited by examiner

Primary Examiner—Dennis M. Butler
(74) Attorney, Agent, or Firm—Conley, Rose & Tayon, P.C.

(57) ABSTRACT

In a digital signal processing system, such as a computer system, an apparatus for communicating digital signals in a plurality of operating domains. The first domain has first timing and control signals synchronized to a first clock. In response to an event, the apparatus dynamically transitions the operation of the synchronous memory to a second domain having second timing and control signals synchronized to a second clock. The first timing and control signals being different in frequency, shape, and protocol than the second timing and control signals. The first clock can be a processor clock to synchronize communication of address and data signals with a processor, and the second clock can be a system clock to synchronize communication of address and data signals with an asynchronous data processing device such as random access memory.

17 Claims, 12 Drawing Sheets

APPARATUS AND METHOD FOR OPERATING CLOCK SENSITIVE DEVICES IN MULTIPLE TIMING DOMAINS

This application is a continuation of application Ser. No. 08/440,151, filed May 12, 1995 now abandoned.

FIELD OF THE INVENTION

This invention relates generally to the communication of digital signals, and more particularly to communicating timing, control, address, and data signals used in computer systems.

BACKGROUND OF THE INVENTION

In modem computer systems, relatively high speed processors manipulate data sourced from memories, and other system components that generally have slower and different operating characteristics than the processor. For example, in a system with hierarchical memories, the data can be persistently stored in relatively slow storage devices such, as disk and tape. Alternatively, the data can be sourced externally from other processors, networks, or input/output devices via I/O interfaces.

Data which are immediately manipulated by the processor are typically stored in faster, but smaller and volatile semiconductor random access memory (RAM). One or more small and high-speed cache memories are usually arranged between the processor and the RAM. The caches, relying on spatial and temporal relationship between data and addresses, store data which have a high likelihood to be used by the processor.

Cache memories can be configured to be physically separate from the processor, e.g., "off-chip." Additional cache memories can be arranged to be co-resident with the processor on the same semiconductor die, e.g., "on-chip." In the later case, the cache memories can be highly specialized. For example, data and instructions for manipulating the data may be stored in separate on-chip caches.

Typically, the processor, memories, and I/O components are interconnected by communication buses that transport timing, control, address, and data signals. The processor, memories, and other system components that share the data can have distinctly different electrical operating requirements and characteristics which may require multiple bus architectures.

For example, the processor and the on-chip cache memories are usually operated by control and address, or "index" signals synchronized to timing signals derived from a high-speed processor clock. The off-chip memory and system components are usually operated by signals synchronized to a slower system clock. The signals used to operate the on-chip and off-chip components, respectively, may have different frequencies, shapes, e.g. length and height, latencies, and protocols. For example, it is not unusual to run the processor clock orders of magnitude faster than the system clock. On-chip components generally run synchronously with respect to timing signals forwarded with the control and address signals, Off-chip components can run asynchronously with respect to skew controlled and radially distributed timing signals.

For these reasons, the electrical environments of the system can be partitioned into separate operating regions or "domains." The processor, and other on-chip components process digital signals in a processor or "private" domain, and the off-chip components process the digital signals in a system or "external" domain.

Processing digital signals in a computer system having multiple operating domains presents a throughput problem. For example, should the processor require access to data that are not accessible in the private domain, e.g., data processed by on-chip high-speed digital signals, then the data needs to be accessed in the external domain using slower signaling environments.

In traditional computer systems, switching operations from one domain to another generally increase access latencies. This is a particular problem for a clock sensitive device such as the off-chip cache that is immediately adjacent and external to the processor chip. In traditional computer systems, the first level of off-chip cache is usually restricted to operate only in the external domain, thus drastically decreasing throughput.

Therefore, there is a need for an apparatus and method which can improve the throughput of computer systems having multiple operating domains and clock sensitive components.

SUMMARY OF THE INVENTION

An apparatus and method in a digital signal processing system, such as a computer system, operates a clock sensitive device, e.g., a synchronous memory, in a plurality of operating domains. The first domain has first timing and control signals synchronized to a first clock. In response to an event, for example, a cache data miss, the apparatus dynamically transitions the operation of the synchronous memory to a second domain having second timing and control signals synchronized to a second clock.

The first timing and control signals are substantially different in frequency, shape, and protocol than the second timing and control signals. The first clock for synchronizing the first timing and control signals can a processor clock to synchronize the communication of address and data signals with a processor of the computer system, and the second clock can be a system clock to synchronize communication of the address and data signals with an asynchronous data processing device such as random access memory operating in the second domain.

The apparatus can include an issue state machine, responsive to the event, for generating an issue signal. An address generator, in response to the issue signal, generating an address signal of the data to be communicated, and a clock generator, also in response to the issue signal, generating an access clock signal. The clock signal is used to propagate the address signal in either the first or second domain.

While processing the cache data miss at a first address in the second domain, the synchronous memory can continue to operate in the first domain. In response to completing the processing of the miss at the first address, the synchronous memory receives the missing data in the second domain. While processing the miss at the first address, the apparatus can increment the first address to a second address, and the processing of missing data at the second address can be initiated before the processing of the miss, e.g. receiving the data, at the first address completes.

DETAILED DESCRIPTION OF A PREFERRED EMBODIMENT

Figure 1:
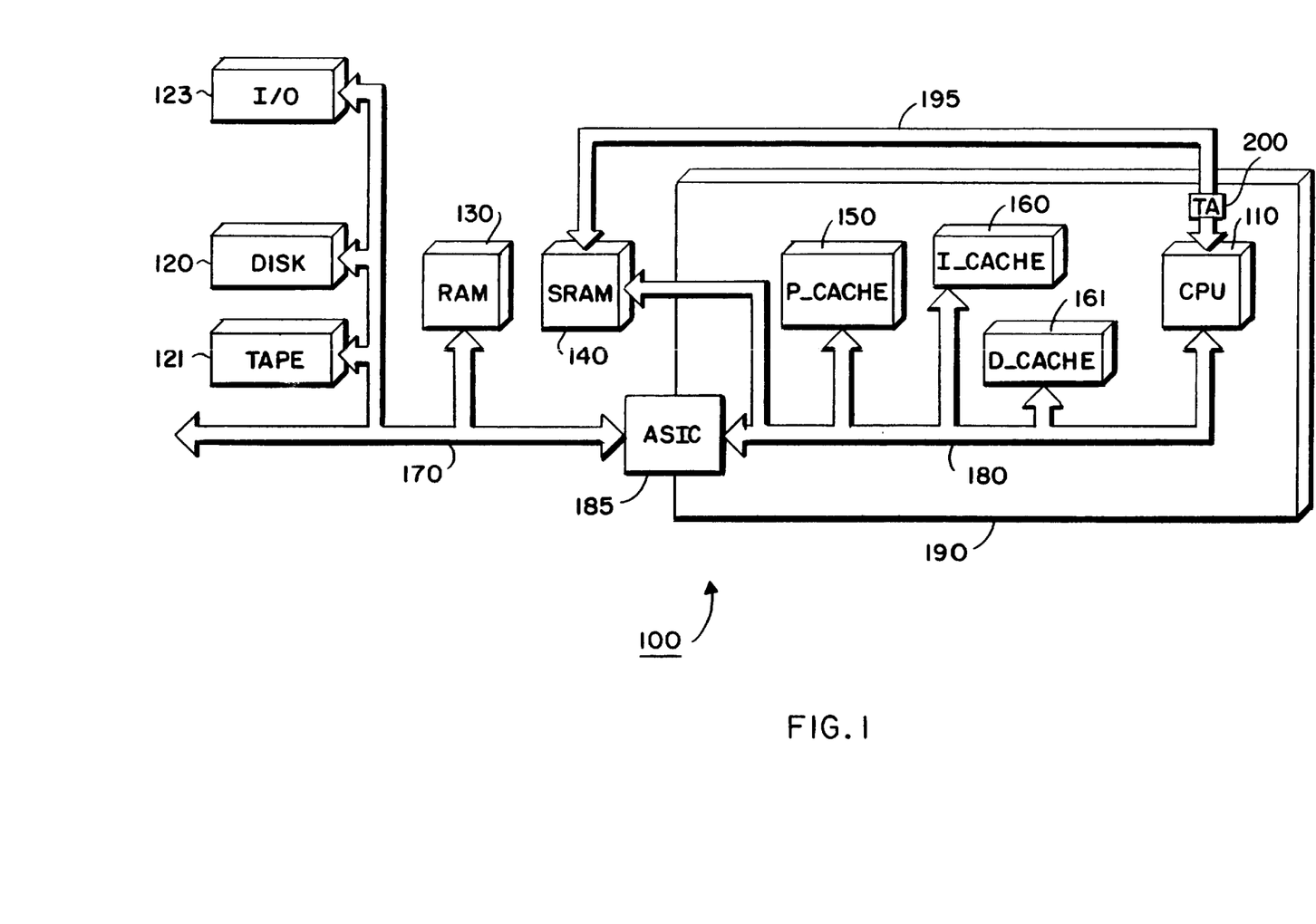
FIG. 1 is a block diagram of a computer system including a transition apparatus according to the invention.

FIG. 1 shows a computer system 100 including a processor 110, and a hierarchical memory arrangement. In the hierarchy shown, the memories, from left to right, generally have decreased access time, and decreased storage capacity. The memories are properly sub-setted. Proper sub-setting meaning that data accessed by the processor exists in a higher level of memory, or not at all. The hierarchical memories can include disk and tape devices 120–121 for persistently storing large amounts of data on bulk, for example, magnetic and optical media, while the system is operating, or not.

The system also includes volatile semiconductor random access memory (RAM) 140. The RAM 130 is used to store data which are manipulated by the processor 110 while the system is operating. The processor can also communicate data with other devices and computer systems via an input/output (I/O) interface 123. The above memories and devices maybe configured to operate asynchronously. Asynchronous components, in response to an access, e.g. read or write, generally signal completion or failure of the access, e.g., data acknowledge (DACK) since the exact time required to complete the access can not be predetermined.

A synchronous random access cache memory (SRAM) 140, relying on spatial and temporal characteristics of addresses and data, stores data and instructions which are anticipated to be immediately used by the processor 110. As an advantage, access to a synchronous device can be accelerated by carefully tracking the clock cycles used to operate the synchronous device, e.g., the SRAM 140. In a preferred embodiment of the invention, the SRAM 140 is configured to operate in a register flow-through mode.

For example, in the SRAM 140, the timing signals are forwarded along with the control, address, and data signals to precisely propagate the signals through the latches, registers, and logic gates of the SRAM 140. By using SRAM technology, a next address signal can be presented at the input of the SRAM 140 before the data signals in response to a previous address signal are latched at an output. With the SRAM 140, accesses effectively overlap each other using a technique called "wave pipe-lining." For example, if an access requires eight cycles to complete, a wave of "−3" would indicate that the next address is issued five cycles after the previously issued address. With wave pipe-lining, the peak band-width of the SRAM 140 can exceed 1 Gigabytes per second. The SRAM 140 is sized to store at least 1 Megabytes of data.

For most modem high speed monolithic processors, a single semiconductor die 190 is used to locate both the CPU 110 and on-chip memories. For example, the die 190, includes a processor cache memory (P-CACHE) 150, a specialized instruction cache memory (I-CACHE) 160 and data cache memory (D-CACHE) 161, as well as the CPU 110.

The processor and the memories are connected to each other by communication buses. The buses transport the timing, control, address, and data signals during operation of the system 100. For example, the off-chip memories, e.g. the DISK 120, the TAPE 121, the RAM 130, and the SRAM 140, and the I/O interface 123 are connected to each other by a system bus 170. The on-chip cache memories, e.g. the P-CACHE 150, I-CACHE 160, and D-CACHE 161, are connected to the processor 110 by a processor bus 180.

Because of inherent design differences, the off-chip components function in an operating domain where the timing and control signals have different frequencies, shape, duty cycles, and protocols than the timing and control signals used by the on-chip components. This means that the system bus 170 operates in a system or external domain, and the processor bus 180 operate in a processor or private domain. An application specific integrated circuit (ASIC) 185 can be used to interface the system bus 170 and the processor bus 180. The ASIC 185 converts signals of one operating domain to another.

Having different operating domains for the off-chip and on-chip components presents a throughput problem. In cases where the processor 110 needs to manipulate data, e.g. a read or write accesses, which are not stored in the on-chip memories, the processor 110 needs to acquire the data from the off-chip memories.

More particularly, any accesses made by the processor 110 to data stored in the SRAM 140 can potentially slow down the operation of the system 100. Therefore, in accordance with the principles of the invention, the SRAM 140, an exemplary clock sensitive device, is configured to operate in both the external domain and the private domain.

In a preferred embodiment of the invention, a transition apparatus (TA) 200 is used to transition the clock sensitive SRAM 140 from one operating domain to another. For example, the apparatus 200 can operate the SRAM 140 in the private domain, or in the external domain.

While the SRAM 140 is communicating data directly with the processor 110, the transition apparatus 200 operates the SRAM 140 in, for example, the private domain. However, should the processor 110 require access to data not stored in the SRAM 140, the operation of the SRAM 140 is dynamically transitioned to the external domain. Moreover, the transition takes place at a soonest possible time, not necessarily waiting for a next processing cycle of the external domain.

The functionality of the private domain is provided, in part, by a private bus 195 which can transports bus signals, e.g. timing, control, and address signals, in either the external, or private domain.

Figure 2:
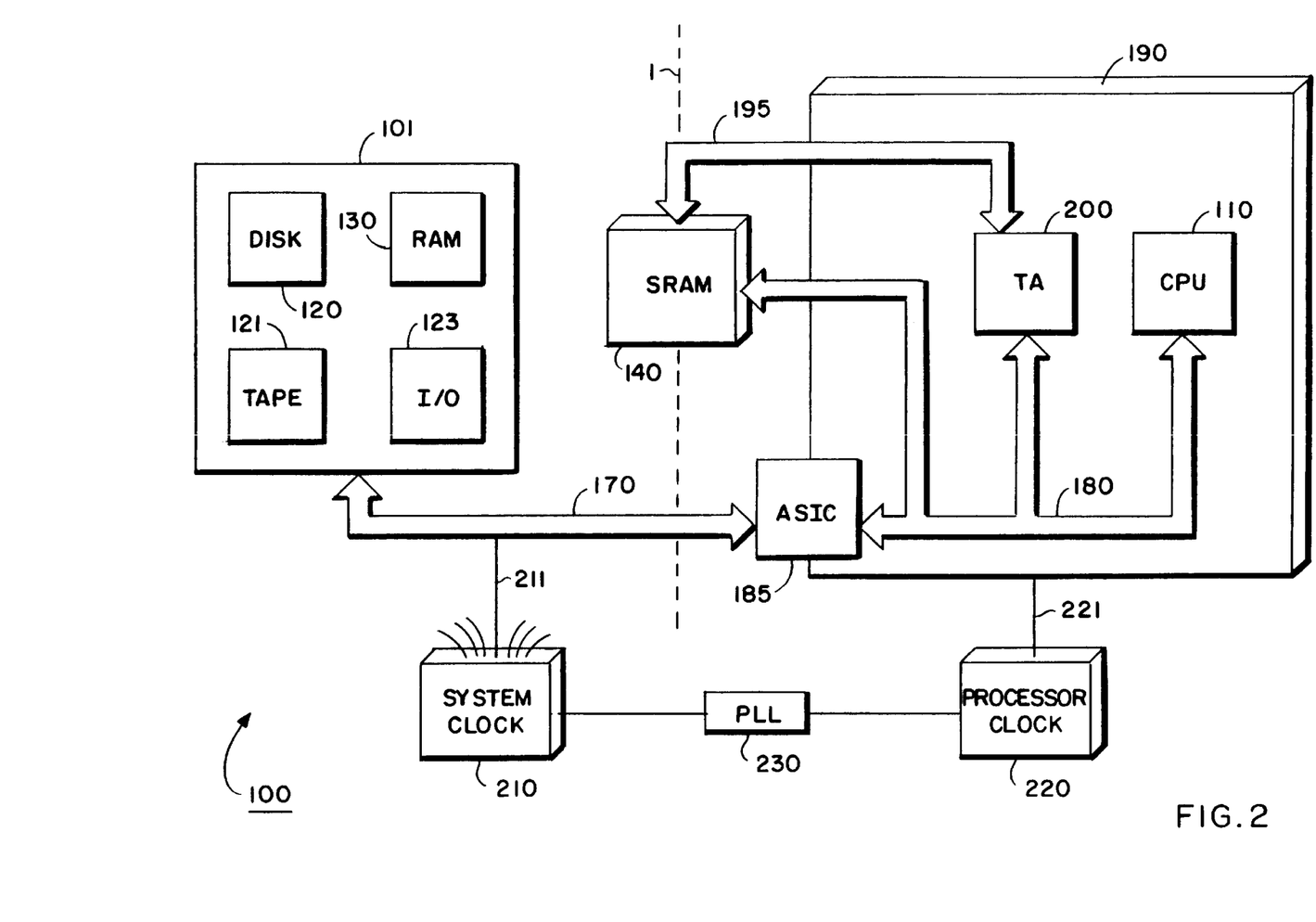
FIG. 2 is a more detailed block diagram of the computer system of FIG. 1.

Now turning to FIG. 2, the apparatus 200 and method for operating the SRAM 140 in more than one domain is described. In FIG. 2, the dashed line 1 generally separates the external domain on the left from the private domain on the right The SRAM 140 straddling the line 1 can operate in either domain.

In the system 100, the components 101, e.g., RAM, disk, tape, I/O, and the system bus 170 are generally constrained to operate in the system or external domain controlled, in part, by a system clock 210. The system clock 210 generates timing signals which have a frequency of, for example, approximately 66.6 MegaHertz (MHz). It should be apparent to those of ordinary skill in the art that the timing frequencies used as examples herein can easily be changed in other implementations. The system timing signals are adjusted for skew and radially distributed to the off-chip components and the on-chip components by lines 211. The lines 211 can be physically integrated into the various buses.

The operation of the on-chip components are synchronized by a processor clock 220. For clarity, the on-chip cache memories are not shown in FIG. 2. The processor clock 220 generates processor timing signals having a frequency of, for example, approximately 666 MHz. The processor 110 uses a divide-by-two circuit to reduce the clock rate down to 333 MHz. This means that the ratio of the processor and system frequencies can be five to one (5:1). One system clock pulse is issued for every five processor clock pulses.

The system and processor clock timing signals are synchronized in phase by a "slip-sync" phase locked loop circuit 230. In a preferred embodiment of the invention, the processor clock 220 runs marginally faster than the specified 333 MHz. In other words, the processor clock signals is allowed to "slip" ahead of the system clock signals. Periodically, if the skew in phase between the processor and system clocks becomes greater than some predetermined value, the processor clock "skips" a cycle to realign the two timing signals in phase.

Figure 3:
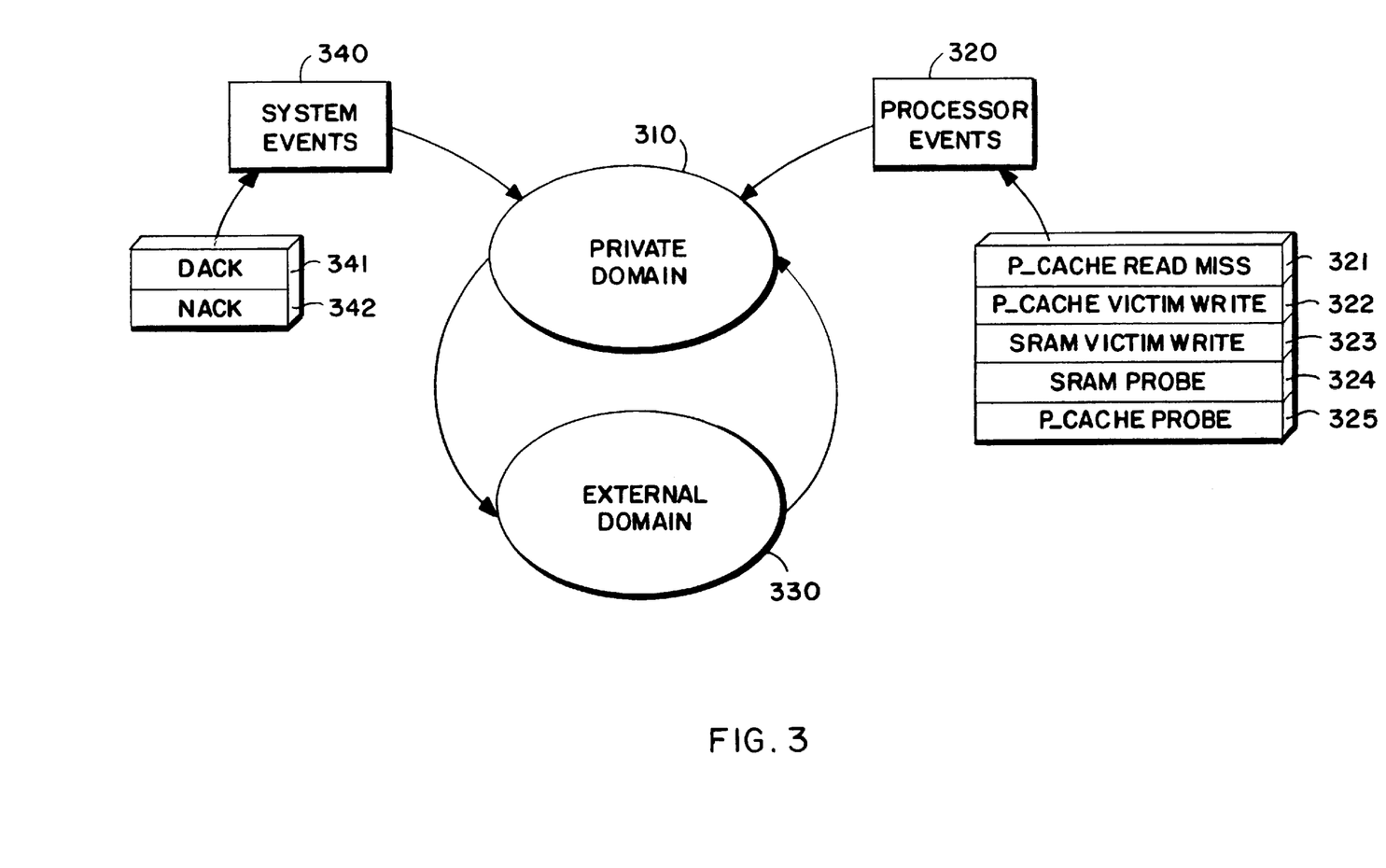
FIG. 3 is a state diagram of the operating domains of the system of FIG. 1.

As shown in FIG. 3, in a preferred embodiment of the invention, the domain transition apparatus (TA) 200 is implemented, in part, as a state machine. The apparatus 200 normally operates the SRAM 140 in the private domain 310 while the system 100 is communication data between the SRAM 140 and the processor 110. While operating in the private domain 310, the apparatus 200 is responsive to processor events 320 and system events 340.

Processor events can include a P-cache read miss 321, a P-cache victim write 322, a SRAM victim write 323, and a SRAM probe 324, and a P-cache probe 325. A read miss 321 is generated if the processor 110 attempt to read data not stored in the on-chip P-cache 150. The victim write 322 is due to the processor 110 forcing modified, or "dirty" data out of the P-cache 150 to make room for new data. The SRAM victim write 323 causes dirty data in the SRAM 140 to be written to a next higher level of the memory hierarchy. The SRAM probe 324 is any other access by the processor 110 to the SRAM 140. The P-cache probe 325 is any other access to the P-cache 150.

The system events 340, such as DACK and NACK, generally indicate completion of a previously initiated access in the external domain 330. The completion, successful or not, requiring further attention in the external domain 330.

While operating in the private domain 310, the private bus 195 behaves synchronously, and is driven by the processor clock 211. Synchronously meaning that accesses to the SRAM 140 progress in determinable steps. Because the accesses are, time-wise, processed predictably, successive accesses can be over-lapped, e.g. a next access can be initiated before a previous access completes.

The events 320 and 340 require operation in the external domain 330. Therefore, in response to these events, the apparatus 200 will dynamically cause the SRAM 140 to operate in the external domain. For example, the access operation, read or write, is launched in the external domain 330. This means that the address signals associated with the read or write are forwarded with respect to the system clock signals. Once the address has been forwarded, the operation of the SRAM 140 reverts back to the private domain 320.

As, in the case of a read access, the data become available from the external memories, the data are into the SRAM 140, while the SRAM 140 is operating in the external domain 340.

This means that the processor 110 can continue to access the SRAM 140 in the high-speed private domain while the external access is pending. The system events 340 will subsequently indicate that the access is about to complete. The data are received in the external operating domain 340. At this time, a next address may be selected for access, or if no further accesses are required in the external domain, operations can immediately revert back to the private domain 320.

Figure 4:
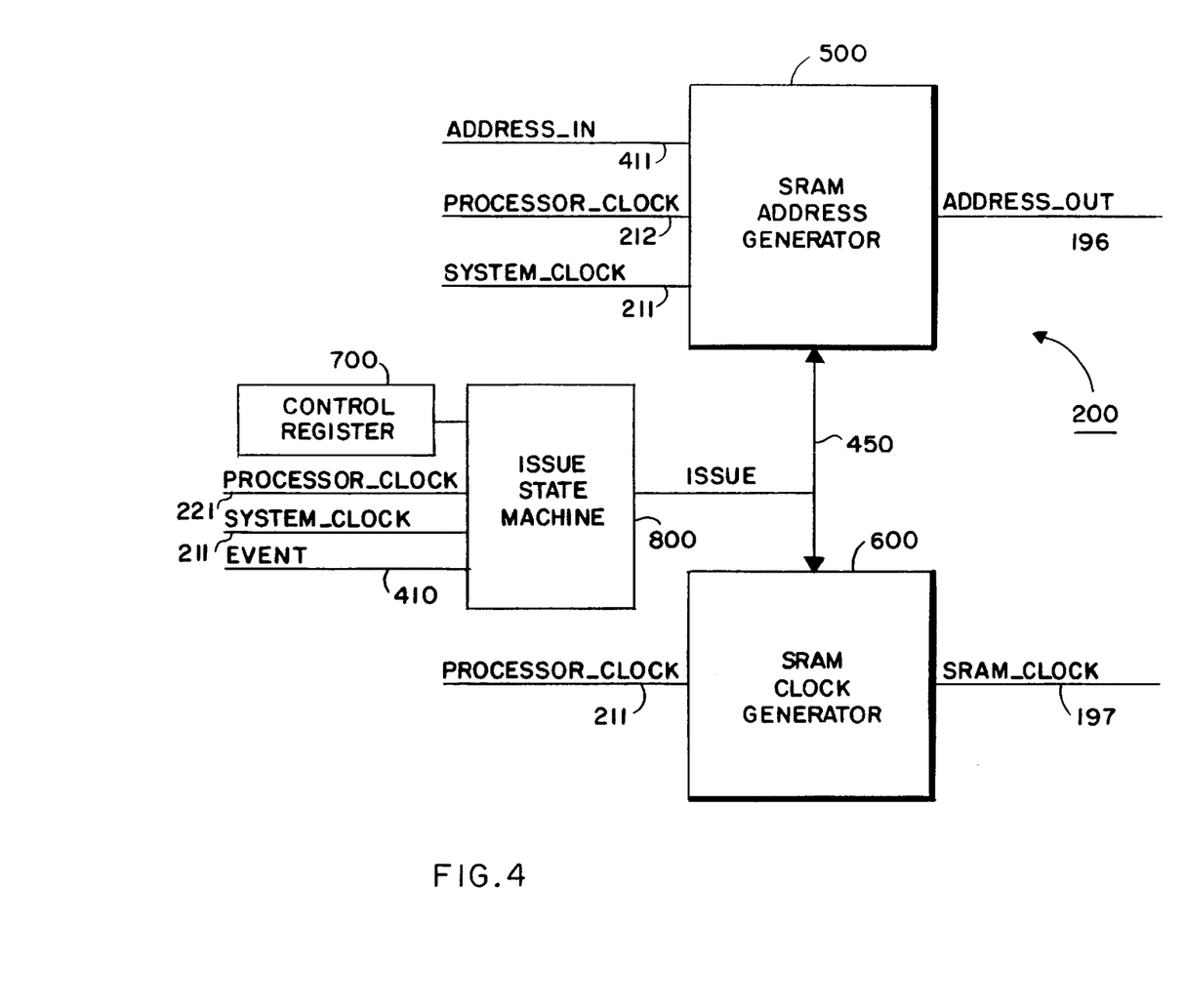
FIG. 4 is a detailed block diagram of the apparatus of FIG. 1.

FIG. 4 shows the apparatus 200 in greater detail. The apparatus 200 includes a SRAM address generator 500, a SRAM clock generator 600, and an issue state machine 800. The issue state machine 800 receives pre-stored and programmable data values from a control register 700. The issue state machine 800 also receives clock signals on lines 211 and 221, and event signals on line 410. The event signals can be generated by the processor 110.

The address generator 500 receives as an input an address_in signal on line 411. The address_in signal is the address that is associated with the events signaled on lines 410. The address generator 500, also receives the processor_clock and system_clock timing signal on lines 211 and 221. The SRAM clock generator 600 receives as an input the processor clock timing signal on line 221.

In response to the event signals 410, the issue state machine 800 generates an issue signal to the address and clock generators 500 and 600. The exact timing, with respect to the system and processor clock signals, of when the issue signal is generated is controlled, in part, by the values obtained from the control register 700, and the relative time interval between system and processor clock pulses, as determined by the issue state machine 800.

For example, according to a preferred embodiment of the invention, while operating in the private domain 310, the address signals are issued at an over-lapping rate which is synchronized to the processor clock 210. In the external domain, a positive response, e.g., DACK, is required before a next event can be processed. During state transitions, the issue state machine also carefully selects the next processor clock pulse which should be used to synchronize the issue signal.

Therefore, in response to the issue signal on line 450, the address generator 500 presents an address_out signal on address lines 196 of the private bus 195 of FIG. 3. Concurrently, the clock generator 600 presents access clock signals, e.g., SRAM_clock, on the timing line 197 of the private bus 195. The frequency of the pulses of the access clock signals depending on whether the access is in the external domain, or an other timing domain, for example, the private domain.

It should be noted that memory caches typically communicate data in quantities known as blocks or lines. Each line of the cache storing data having multiple, for example four, physically adjacent addresses in the RAM 130. Therefore, transferring data for any address in the cache line can cause the transfer of all data of the line. Thus, in the preferred embodiment, a cache transfer from a first address presented on line 411, also causes three additional transfers for the other data of the cache line. Each transfer is handled independently in successive transfers. In the preferred embodiment as shown in FIG. 4, the address generator 500, generates four address-out signals for each event.

Figure 5:
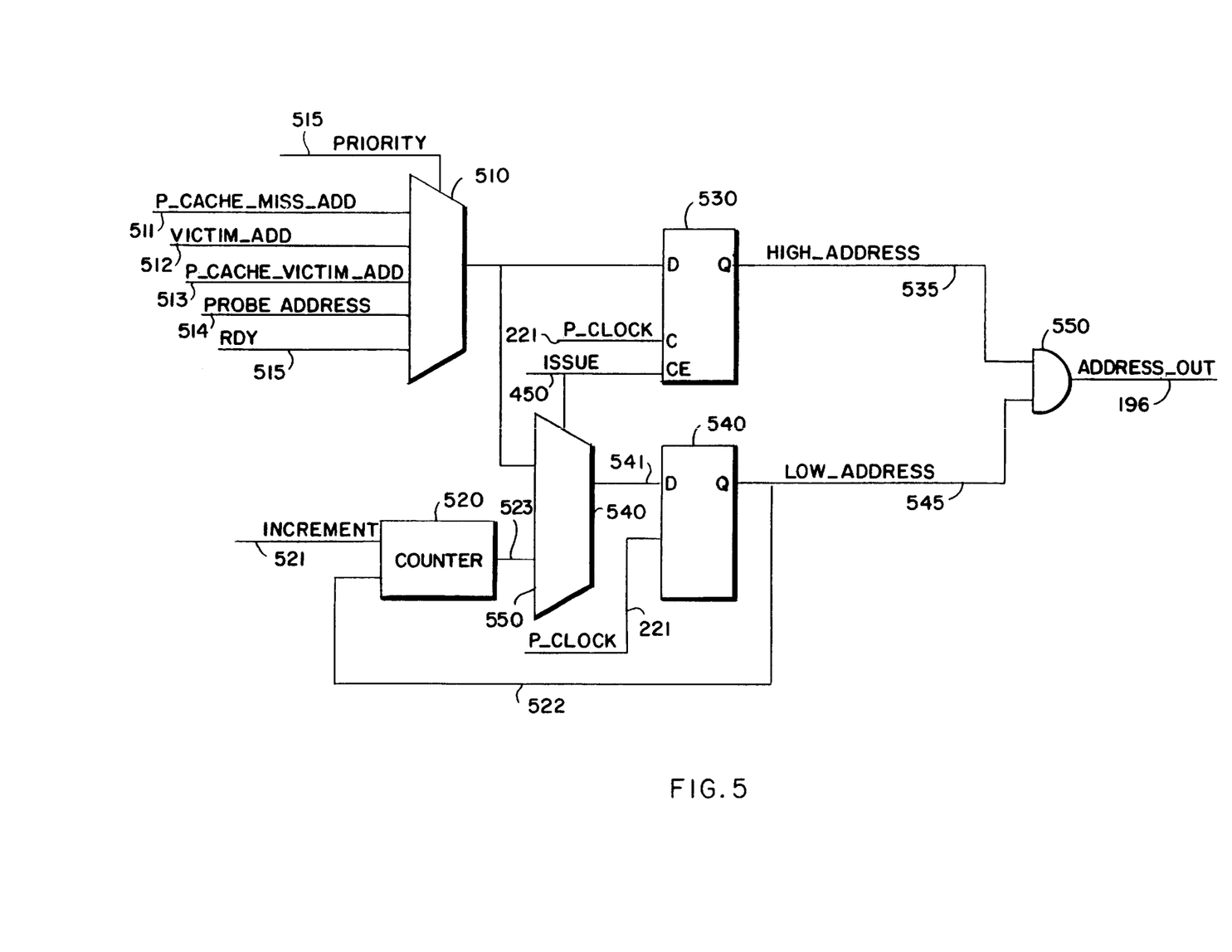
FIG. 5 is a circuit diagram of an address generator used by the apparatus.

FIG. 5 shows the address generator 500 in greater detail. The address generator 500 includes a first multiplexor 510 which is connected to receive addresses on lines 511–514, e.g. "line 411 of FIG. 4. The multiplexor 510 also receives a priority signal on line 515. The priority signal can be used to order the processing of events. For example, the occurrence of a higher priority event, for example, the P-cache read miss 321 can be processed in advance of an earlier occurring but lower priority event, such as the SRAM probe 324.

A counter 520 receives an increment signal on line 521. The counter receives a predetermined number of, for example four, increment signals for each of event processed. A first latch 530 receives the output of the multiplexor 510 at a D input via line 531. The latch 530 also receives the processor clock signal and the issue signal at C and CE inputs via line 221 and 450. The output of the latch 535, on line 535 form, a high portion of the address.

The output of the multiplexor 510 is also connected to a second multiplexor 550. The second multiplexor 550 also receives as input the output of the counter 520. The second multiplexor 550 is selected by the issue signal on line 450. The output of the multiplexor 550 is coupled to the D input of a second latch 540. The latch 540 also receives the processor clock timing signal on line 221. The Q output of the second latch 540 form a lower portion of the address on line 535. The signals on lines 535 and 545 can be combined by circuit 550 to form the address __out signal line on line 196 of the private bus 195.

During operation of the address generator 500, events are signaled on line 511–514. Each event is associated with a priority signal presented on line 515. For each event, for example, four increment signals are generated. The increment signals, in combination with the address__in signals, form the addresses__out signals to be used to access the data stored in the memories.

Figure 6:
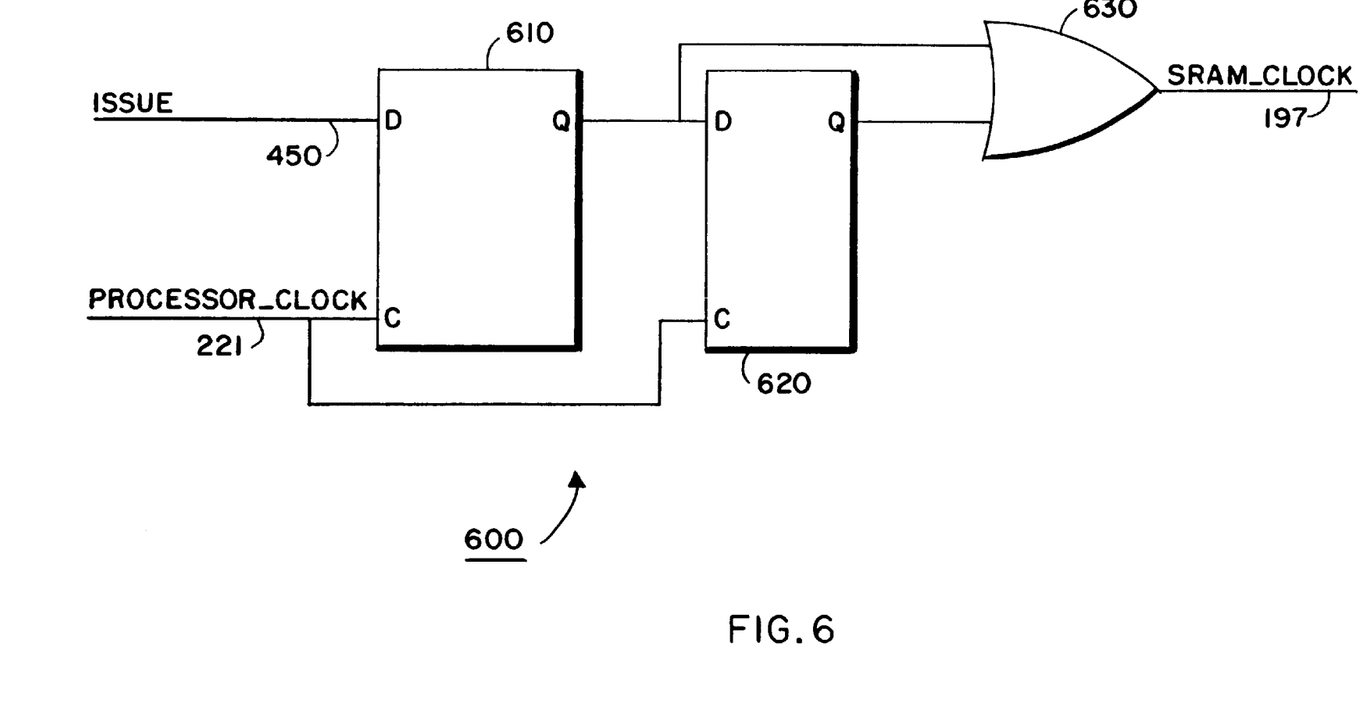
FIG. 6 is a circuit diagram of a clock generator used by the apparatus.

FIG. 6 shows the SRAM clock generator 600 in greater detail. The exemplary circuit shown includes two latches 610 and 620, and an AND gate 630. The components are connected to form a divide-by-two circuit. During operation of the generator 600, in response to the issue signal and the processor clock signal being received, the pulse width of the processor clock is "stretched" to twice its normal length. The resultant clock signal, SRAM-clock, on line 197 is used to clock the address signals on line 196 while they are processed.

The width of the pulses of the SRAM$_{13}$ lock access signal is designed to exceed the minimum time required to latch the address signals into an input register of the SRAM 140. In alternative embodiments, the generator 600 can derive access clock signals that have different shapes and duty cycles than the signals produced by the processor clock. For example, the generator 600 can include differential amplifiers to increase the amplitude of the access clock signals. Additionally, by using additional latches, the width of the pulses of the SRAM__clock access signal can be shaped to any desired length, height, and frequency which meets the specifications determined by the manufacturer of the SRAM 140.

Figure 7:
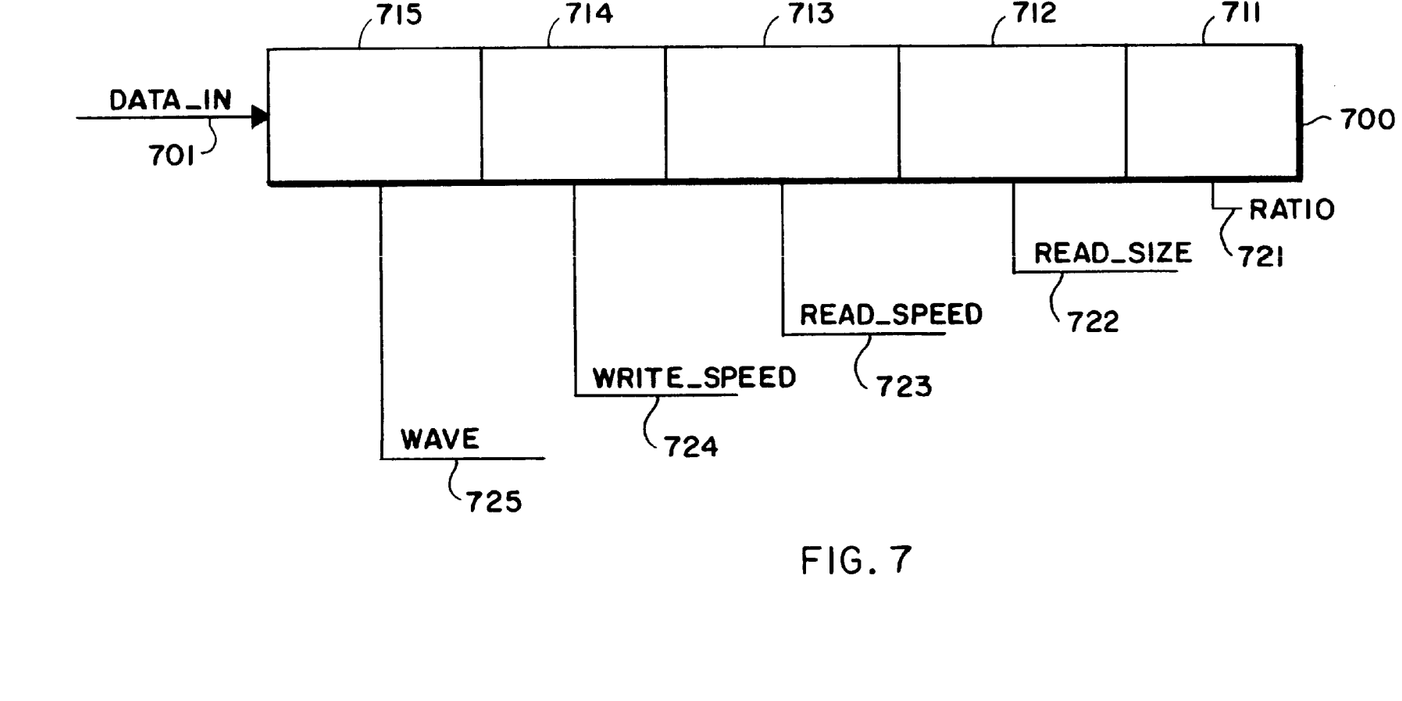
FIG. 7 is a block diagram of a control register used by the apparatus.

FIG. 7 shows the control register 700. The control register 700 is partitioned into, for example, five fields 711–715. A ratio field 711 stores the number of pulses that are issued by processor clock signals for every pulse of the system clock signal. This field can be four bits to stores values in the range of one to sixteen. For the purpose of the exemplary embodiment, a value of five is stored in the ratio field 711.

A read-size field 712 stores the number of addresses that need to be generated for each event This field can be four bits to handle cache line that store up to sixteen addressable words. An example value for the read__size field 712 is four.

A read__speed field 713 stores a value which represents the number of SRAM clock pulses cycles required to process the event. The first pulse strobing an address into the input latches of the SRAM 140, and a last clock pulse latching the output data by the processor 110. This value typically can be, depending on the design of the SRAM in the range of four to eight, e.g. three bits should suffice. Similarly, the write-speed field 714 stores the number of cycles required to propagate a write access.

The wave field 715 stores a value which indicates how soon, measured in clock pulses, a next address can be generated after a previous address has been submitted. Recall, in synchronous random access memories, throughput can be increased by overlapping, or "wave pipe-lining" successive accesses.

If the control register 700 is configured as a shift register, the fields 711–715 can be loaded with predetermined values whenever the system 100 is started, via data-in signals on line 701. During operation of the system 100, the bit values of the control register 700 are presented to the issue state machine 800 as they are needed on lines 721–725.

Figure 8:
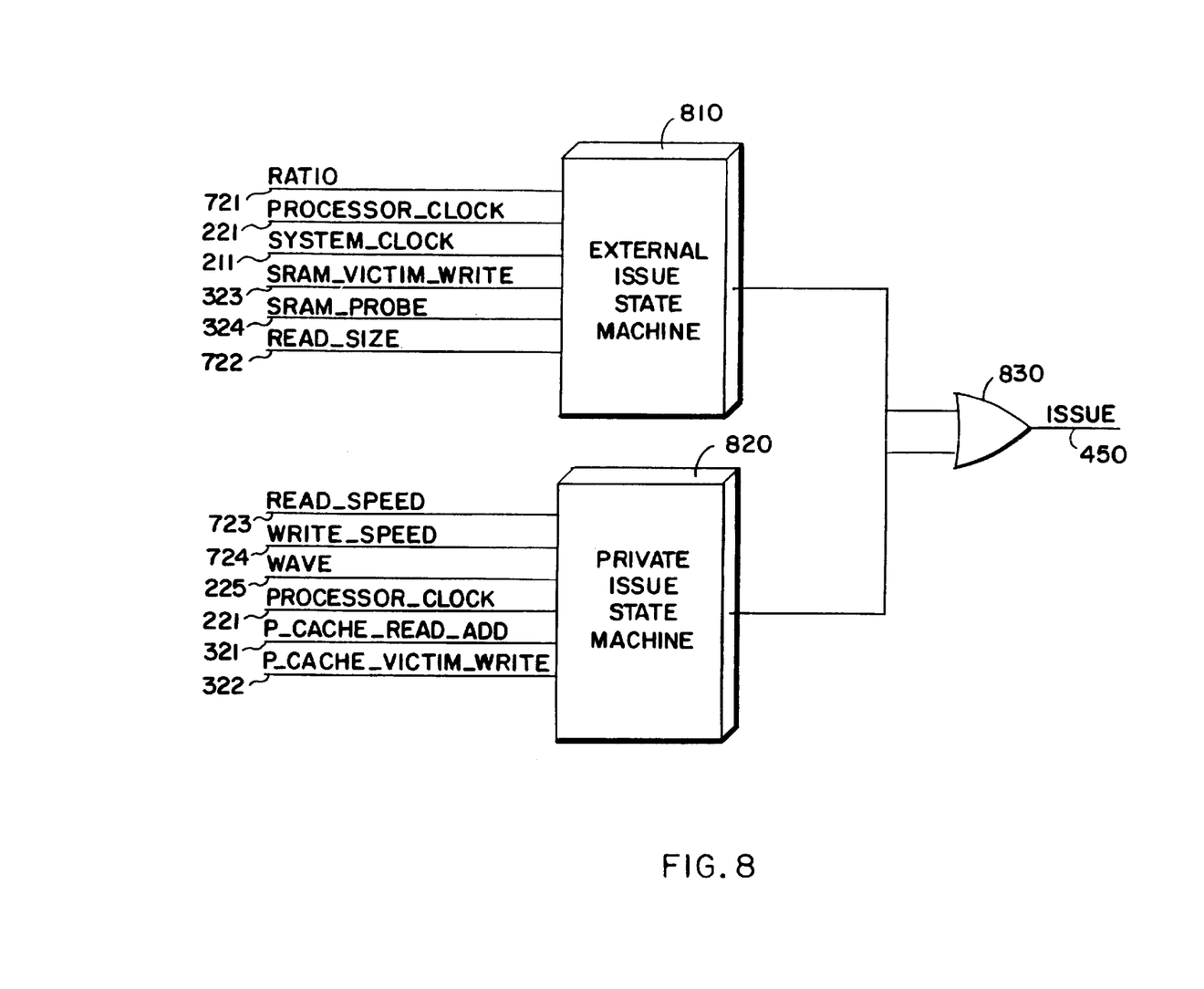
FIG. 8 is a block diagram of an issue state machine used by the apparatus.

FIG. 8 shows the issue state machine in greater detail. The issue state machine includes an external issue state machine 810, a private issue state machine 820, and a gate 830 for producing the issue signal on line 450. The external issue state machine 810 receives as input, the ration 711, the system and processor clock signals on line 211 and 221, the read__size 712, and signals representing events that are to be processed in the external domain 330.

The private issue state machine 820 receives, from the control register 700, the read__speed 723, the write speed 724, and the wave 725. The machine 820 also receives the processor clock, via line 221, and signals which indicate events to be processed in the private domain 310, e.g. P-cache__read__miss 321, and P-cache__victim__write 322.

During operation of the issue state machine 800, the issue signal on line 450 is produced in response to events 321–324.

Figure 9:
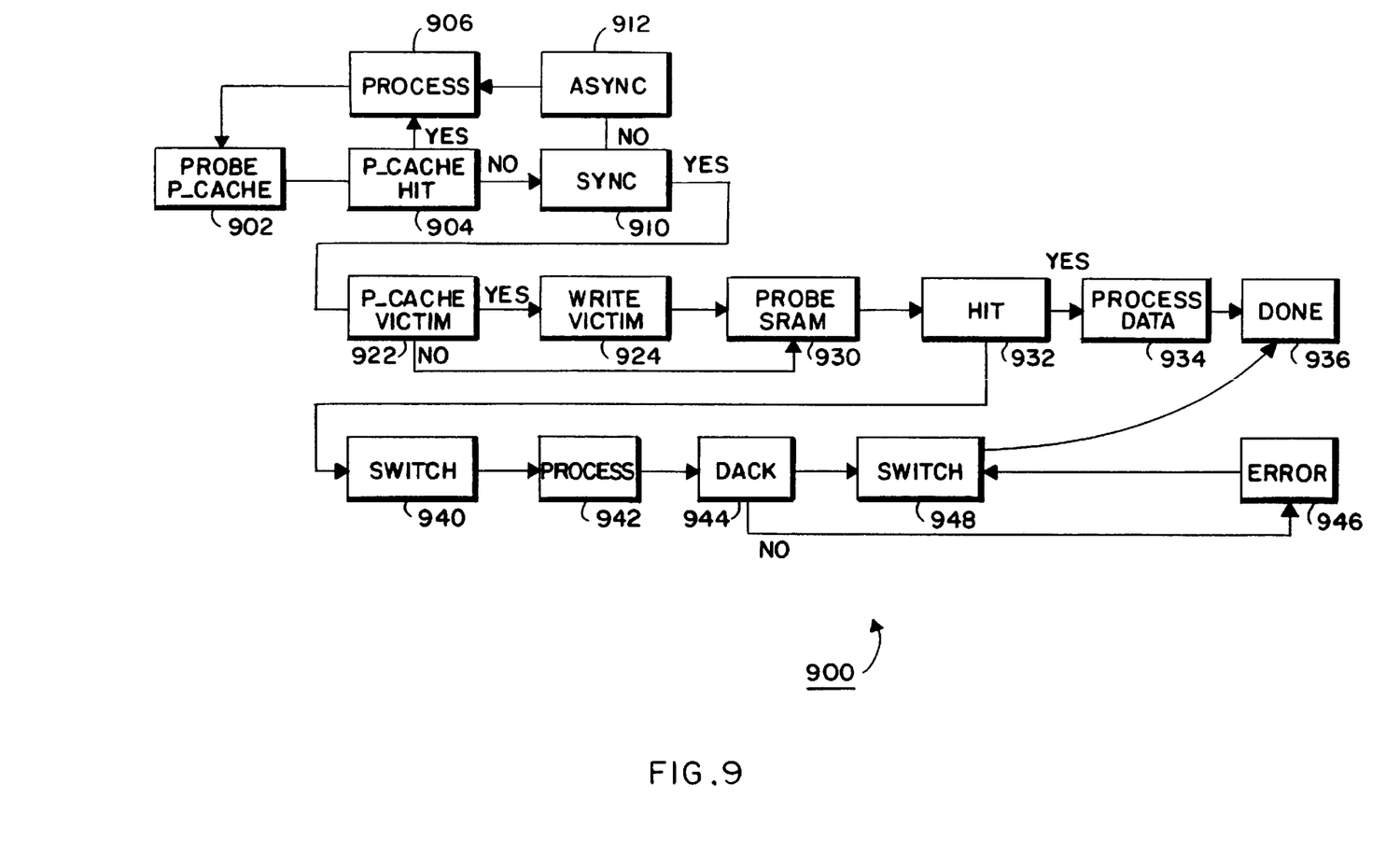
FIG. 9 is a flow diagram of the operation of the issue state machine of FIG. 8.

FIG. 9 is a flow diagram which shows an operation 900 of the system 100 equipped, according to the invention with the transition apparatus 200. While normally operating in the private domain, in step 902, the processor 110 probes the P-cache 250 with an address to either read or write data at the address. In step 904, a determination is made whether or not the address is valid, e.g. a "hit." A hit meaning the probed address which is valid for reading or writing data.

In the case that the probe is a hit, the access is processed, step 906, so that a next probe can be serviced. However, if the address is not valid, e.g. a "miss", a determination is made, in step 910, if the next higher level of memory, e.g. the cache 140 operates asynchronously. It the answer is true, the access is processed conventionally in step 912.

If the answer is false, e.g., the cache 140 operates synchronously, in step 922, it is determined if the data stored at the probed address are "dirty." Dirty meaning the data have been modified and need to be stored in a higher level of the memory hierarchy before new data can be stored at the address. This, known as a "victim write" is done in step 924.

In any case, whether the data are dirty or not, a miss in the P-cache 150 requires a probe of the SRAM 140, step 930, and determine if the probe results in a hit, step 932. If the address is valid in the SRAM 140, process the access, step 934, and the access is completed in step 936, at which time a next probe can be processed.

Otherwise, if the probe of the SRAM 140 is a miss, in step 940, switch to the external timing domain 300. Initiate the access in step 942. While the access is processed by the external memory components, the SRAM 140 can continue to operate in the private domain. Each completed transfer of data is signaled. If a DACK signal is not received in step 944 in response to processing an access, an error is assumed, step 946. Upon a completion, switch back to the private domain 310 in step 948.

The transition apparatus 200 issues address, data, and control signals at an earliest possible time to decrease memory access latencies. More particularly, when switching from the private to the external domain, the signals can be issued during a previously generated system clock pulse.

Figure 10:
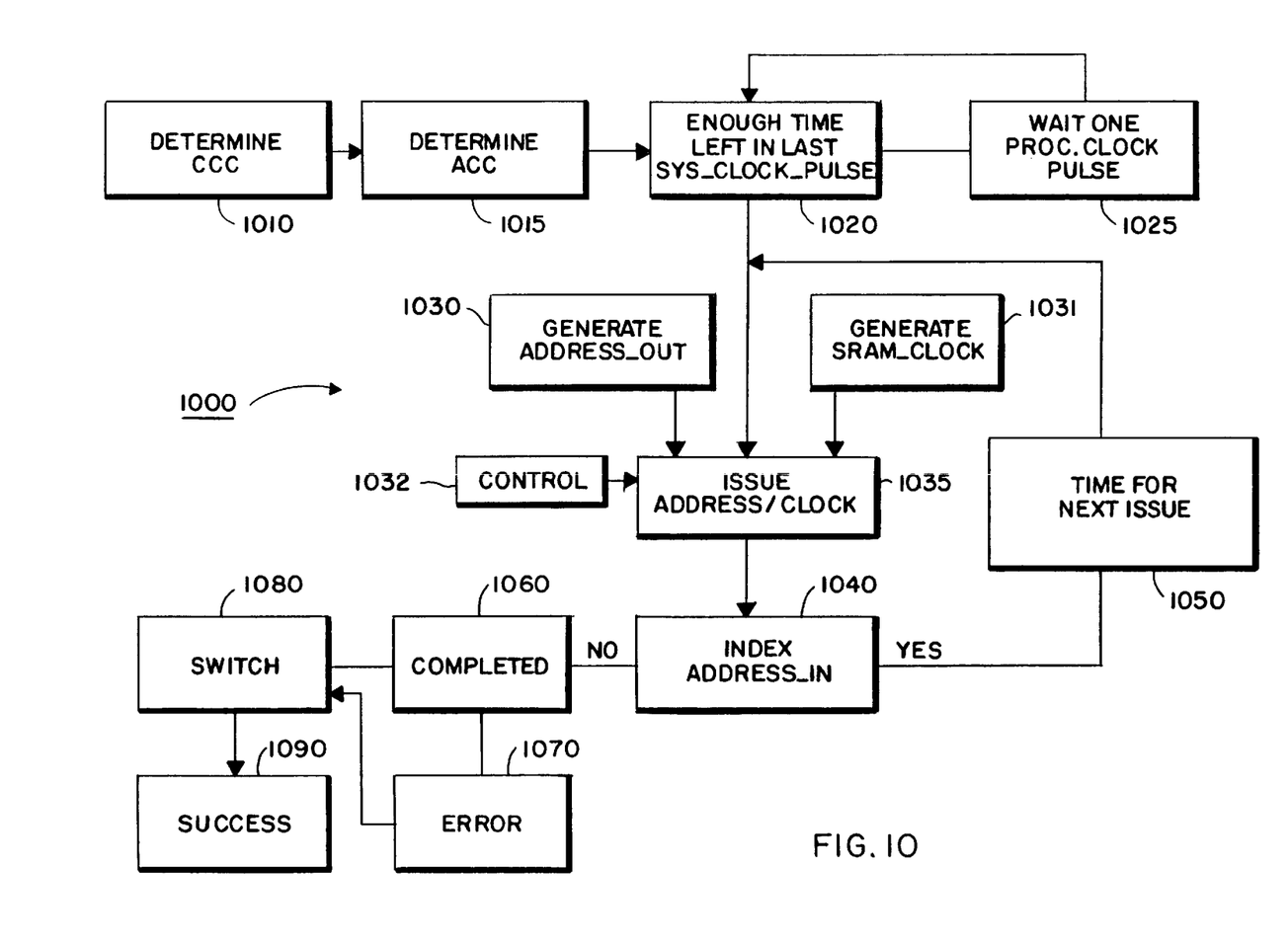
FIG. 10 is a detailed flow diagram of precess steps used by the state machine of FIG. 9.

A process 1000 including the illustrated steps gain a timing advantages as follows. In step 1010, a current_clock_cycle (CCC) is determined. The CCC can be determined from a count down register which is loaded with the ratio 711 of the control register 700. Each time a processor clock pulse is generated, the CCC is counted down, and on every system clock pulse, the CCC is reset The register storing the CCC can be read to determine how many processor clock pulses remain to be generated during a particular system clock cycle.

In step 1015, an access_cycle-count ACC is determined. The ACC is the number of cycles to complete a SRAM access, read, or write. For example, if the READ-SPEED 723 is six, and the wave is minus three, than addresses can safely be presented to beginning of the access pipeline, e.g. the private bus 195, every three processor clock pulses without having the data at the output being subjected to overwrite.

In step 1020, a determination is made if there is enough time left in the last system clock pulse that was generated to issue the next SRAM access. The time interval is sufficient if the CCC minus the ACC is equal to, or greater than zero (CCC-ACC>=0). if there is insufficient time, wait one processor clock pulse, step 1025, and re-time.

Note, this methodology allows for variable wave-pipe-lining since the determinations are made as the accesses are performed according to values stored in the control register 700. Different access types, e.g. read, write, write-through, etc. can have defined different "wave-pipe-lining" values in the control register 700.

Also, the wave-pipeline values can be set differently for the different operating domains. For example, addresses can be generated at a higher wave rate in the private domain than in the external domain. System of know design, generally do not "wave" write accesses, e.g. victims, dirty reads, writes or fills, while they operate in the external domains.

If there is time, the issue state machine generates the issue signal (1035), and the generated address_out and SRAM-clock signals (1030–1031) are forwarded in to the access pipe, along with appropriate control signals 1032. Control signals can include read/write memory or I/O, fill, write-through, etc.

Therefore, as an advantage here, after a miss in the on-chip caches, or more expediently, as soon as a is detected, even mid-cycle, the processor can issue the next off-chip cache control and address signals independent of the relative positions of the current processor and system clock pulses. Waiting for the rising edge of the next system clock pulse, as is commonly done, unnecessarily delays throughput, and adversely effect performance of the system 100.

In step 1040, the address$_{13}$ in signal is indexed to a next higher address every "n" SRAM_clock pulses, e.g. the value ACC. The next issue signal is generated in step 1050. Completion 1060, requires the generation of four, e.g. read_size 721, addresses-out signals. Unsuccessful completion is indicated in step 1070. In any case, in step 1080, switch the TA 200 back to the private domain 310, on the next processor clock pulse.

Figure 11:
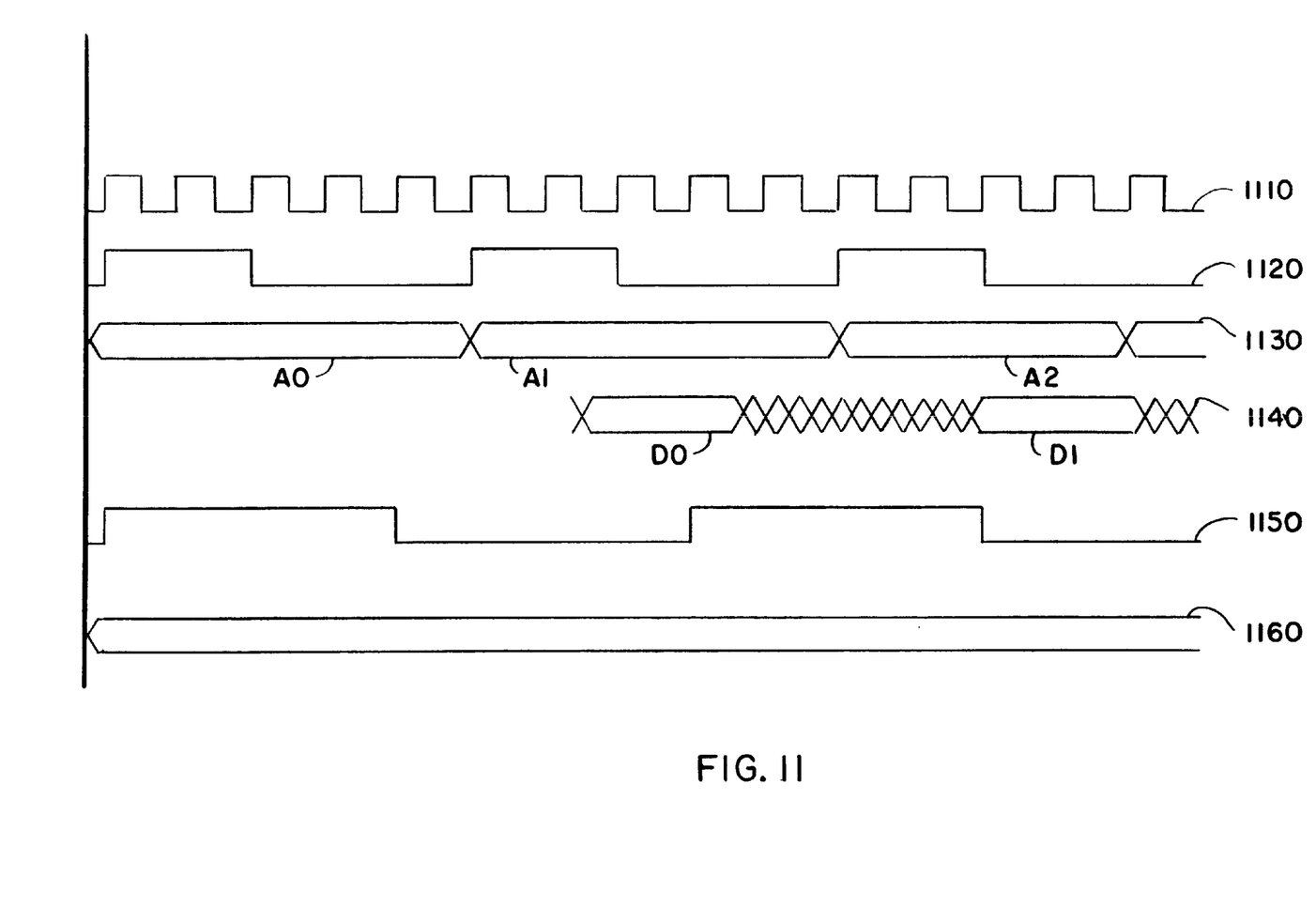
FIG. 11 is a timing diagram of read accesses.
Figure 12:
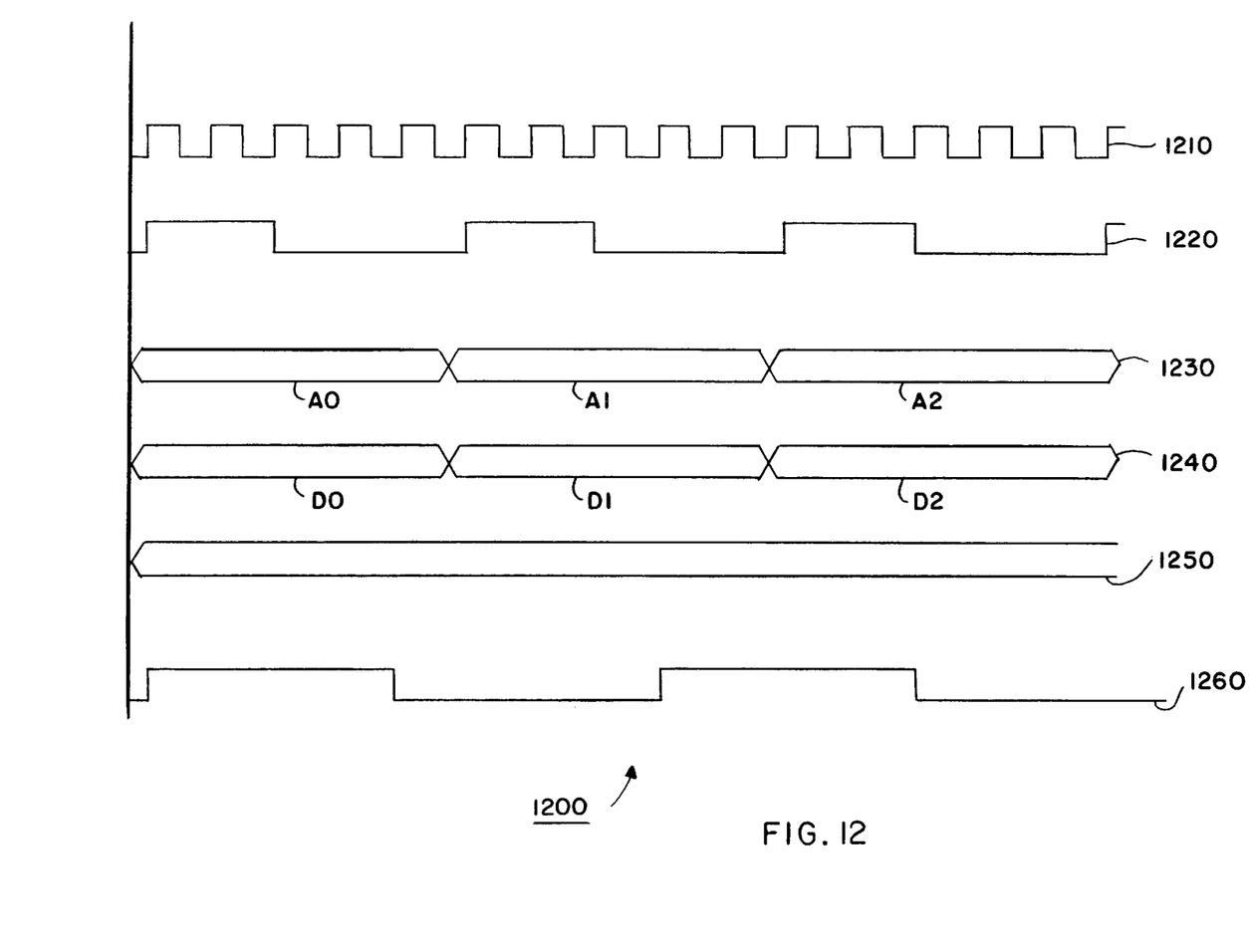
FIG. 12 is a timing diagram of write accesses.

Example timing, control, address, and data signals for read and write accesses generated by the TA 200 according to the preferred embodiment are shown in FIGS. 11 and 12. In FIG. 11, the signal traces are the processor clock signal 1110, the SRAM clock signal 1120, address signals 1130, for example, A0, A1, and A2, data signals 1140, such as, D0 and D1, the system clock signal 1150, and a "read" control signal 1160. In other words here, the timing diagram illustrates a read access.

Initially, the signals are synchronized to the onset, or rising edge of the system clock signal 1150. Here, the read_speed is eight, and the wave is -3. Therefore, the address generator 500 produces a new address every five processor clock pulses. The timing diagram shows that the data D0 in response to the address A0 can be latched at the input to the processor 110 as soon as eight processor pulses after the read access is initiated, and every five processor clock pulses thereafter.

FIG. 12 generally shows the timing diagram for write accesses. The signal traces are the processor clock signal 1210, the SRAM clock signal 1220, address signals 1230, e.g. A0, A1, and A2, data signals 1240, e.g. D0 and D1, a "write" control signal 1250, and the system clock signal 1260. In other words here, the timing diagram illustrates a write access.

A significant performance improvement is gained during the writing of data to the SRAM 140. Recall, writing occurs during the victim write, or for cache "fills". A write via the private bus 195 can occur on any pulse of the processor clock signal. During writing address and data signals are generated concurrently along with the write control, e.g. enable, signal. As shown, data are written every five processor clock pulses.

While a method and apparatus for dynamically operating a computer system in two specific timing domains, those skilled in the art will recognize that the method and apparatus could be readily adapted to other timing domains that are different from each other, and other clock sensitive devices which have synchronous signalling capabilities.

For example, the clock sensitive device can be a synchronous video frame buffer. While video data stored in the buffer are being processed, the frame buffer can operate in the private domain. As new video data are acquired into the frame buffer from external video sources, the frame buffer can operate in the external domain.

While specific implementations of the invention have been described, those familiar with the art will appreciate that the invention may be practiced in other ways while still remaining within the scope and spirit of the appended claims.

What is claimed is:

1. In a digital signal processing system, an apparatus for communicating digital signals in a plurality of domains, comprising:

a first clock generating first timing signals for a first timing domain;

a second clock generating second timing signals for a second timing domain, the first and second clocks operating substantially independent of each other;

a clock sensitive device, connected to the first and second clocks, operating in the first timing domain, the first timing domain synchronized to the first timing signals of the first clock; and, means, responsive to an event, for dynamically transitioning the operation of the clock sensitive device to the second timing domain, the second domain synchronized to the second timing signals of the second clock.

2. The apparatus as in claim 1 wherein the first clock is a processor clock, and wherein the clock sensitive device is a synchronous memory communicating address and data signals with a processor operating in the first timing domain, and wherein the second clock is a system clock, and wherein the synchronous memory communicates address and data signals with an asynchronous data processing device operating in the second timing domain.

3. The apparatus as in claim 2 further comprising:

a phase locked loop circuit connected to the first and second clocks to synchronize the first and second timing signals of the processor clock and the system clock.

4. The apparatus as in claim 1 wherein the first timing domain is synchronized to a processor clock, and the second timing domain is synchronized to a system clock, the frequency of the processor clock and the frequency of the system clock being different, and where the clock sensitive device is a synchronous memory, the synchronous memory communicating address and data signals with a processor while operating in the first timing domain, and the synchronous memory communicating address and data signals with an asynchronous data processing device while operating in the second timing domain.

5. The apparatus as in claim 4 further comprising:

an issue state machine generating an issue signal in response to the event;

an address generator, in response to the issue signal, generating an address signal of the data to be communicated;

a clock generator generating an access clock signal in response to the issue signal, the access clock signal to propagate the address signal of the data.

6. The apparatus as in claim 5 wherein the address generator further comprises:

a counter to increment the address signal a predetermined number of times in response to the event.

7. The apparatus as in claim 5 wherein the clock generator further comprises:

a divide-by-two circuit coupled to the processor clock and the issue state machine, the divide-by-two circuit deriving the access clock signal from the processor clock in response to the issue signal.

8. The apparatus as in claim 5 further comprising:

a control register, the control register storing a ratio, a read size, a read speed, a write speed, and a wave, the control register coupled to the issue state machine, the ratio indicating the number of pulses generated by the processor clock for every one pulse generated by the system clock, the read size indicating the predetermined number of times the address signal is incremented by the counter, the read speed indicating a number of access clock signals required to process a read access, the write speed indicating a number of access clock signals required to process a write access, and the wave indicating the number of access clock signals required before a next read access can be processed after a last read access has been initiated by the issue signal.

9. The apparatus as in claim 5 further comprising:

means for generating the issue signal independent of when a last system clock signal was generated.

10. The apparatus as in claim 1 wherein the clock sensitive device is a synchronous memory, further comprising:

means for initiating a data access in the second timing domain using the second timing signals;

means, while processing the data access in the second timing domain, for transitioning the synchronous device to operate in the first timing domain.

11. The apparatus as in claim 1 wherein the first clock is a processor clock to synchronize the first timing signals, the second clock is a system clock to synchronize the second timing signals, a processor operating in the first timing domain, an asynchronous data processing device operating in the second timing domain, and the clock sensitive device is a synchronous memory, the synchronous memory communicating address and data signals with the processor while operating in the first timing domain and the synchronous memory communicating address and data signals with the asynchronous data processing device while operating in the second timing domain.

12. The apparatus as in claim 11 wherein the asynchronous device is a random access memory, and wherein the event is a data miss in the synchronous memory, the data miss requiring missing data at a first miss address and at a second miss address of the synchronous memory, and further comprising:

means, in response to the data miss, for initiating the processing of the data miss at the first miss address in the second domain;

means, while processing the data miss at the first miss address in the second domain, for continuing to operate the synchronous memory in the first timing domain; and means, in response to a completion of the processing of the data miss at the first miss address, for transitioning the synchronous memory to operate in the second timing domain to receive the missing data at the first miss address, and for transitioning the synchronous memory to operate in the first timing domain after receiving the missing data at the first miss address in the second timing domain.

13. The apparatus as in claim 12 further comprising:

means, while processing the data miss at the first miss address in the second timing domain, for incrementing the first miss address to a second miss address; and means, while processing the data miss at the first miss address in the second timing domain, initiating the processing of the data miss at the second miss address in the second timing domain.

14. The apparatus as in claim 12 further comprising:

means for determining a next processor clock signal to transitioning the operation of the synchronous memory from the first timing domain to the second timing domain.

15. In a digital signal processing system, a method for operating a clock sensitive device in a plurality of domains, comprising:

generating first timing signals form a first clock for a first timing domain;

generating second timing signals form a second clock for a second timing domain;

operating the first and second clocks substantially independent of each other;

operating a clock sensitive device connected to the first and second clocks in the first timing domain;

in response to an event, dynamically transitioning the operation of the clock sensitive device to the second timing domain, the second timing domain synchronized to the second timing signals of the second clock, the first timing and signals being different in frequency, shape, and protocol than the second timing signals.

16. The method as in claim 15 wherein the first clock is a processor clock, and wherein the clock sensitive device is a synchronous memory communicating address and data signals with a processor operating in the first timing domain, and wherein the second clock is a system clock, and wherein the synchronous memory communicates address and data signals with an asynchronous data processing device operating in the second timing domain.

17. The method as in claim 15 wherein first timing signals are synchronized to a processor clock, and the second timing signals are synchronized to a system clock, and where the clock sensitive device is a synchronous memory, and further comprising:

communicating address and data signals between the synchronous memory and a processor while operating in the first timing domain; and communicating address and data signals between the synchronous memory and an asynchronous data processing device while operating in the second timing domain.

* * * * *